United States Patent [19]

Forish

[11] Patent Number: 5,529,535
[45] Date of Patent: Jun. 25, 1996

[54] LAMP SOCKET AND BACKPLATE ASSEMBLY AND METHOD OF MAKING SAME

[75] Inventor: John A. Forish, Fort Wayne, Ind.

[73] Assignee: Zanxx, Inc., Avilla, Ind.

[21] Appl. No.: 314,869

[22] Filed: Sep. 29, 1994

[51] Int. Cl.$^6$ ............................................. H01R 9/09
[52] U.S. Cl. ........................... 439/56; 439/699.2; 362/61
[58] Field of Search ........................... 439/56, 57, 699.2, 439/559; 362/61, 267

[56] References Cited

U.S. PATENT DOCUMENTS

| | | | |
|---|---|---|---|
| 3,555,341 | 1/1971 | Curtis | 439/57 |
| 5,002,492 | 3/1991 | Bassi | 439/56 |
| 5,060,121 | 10/1991 | Cunningham et al. | 362/61 |

Primary Examiner—P. Austin Bradley
Assistant Examiner—Jill Demello
Attorney, Agent, or Firm—Burns, Doane, Swecker & Mathis

[57] ABSTRACT

A backplate and socket assembly wherein the backplate includes a first substantially rigid panel and a second substantially rigid panel. The panels each include a plurality of apertures which are aligned with each other. The plurality of conductors are disposed between the first and second panels and are sealed therebetween. The conductors include a plurality of contact pads which extend into the first apertures. A plurality of lamp sockets are respectively disposed in the plurality of first and second apertures. Each lamp socket includes a contact for electrically contacting respective contact pads. Seals are provided between the lamp sockets and the first panel.

8 Claims, 9 Drawing Sheets

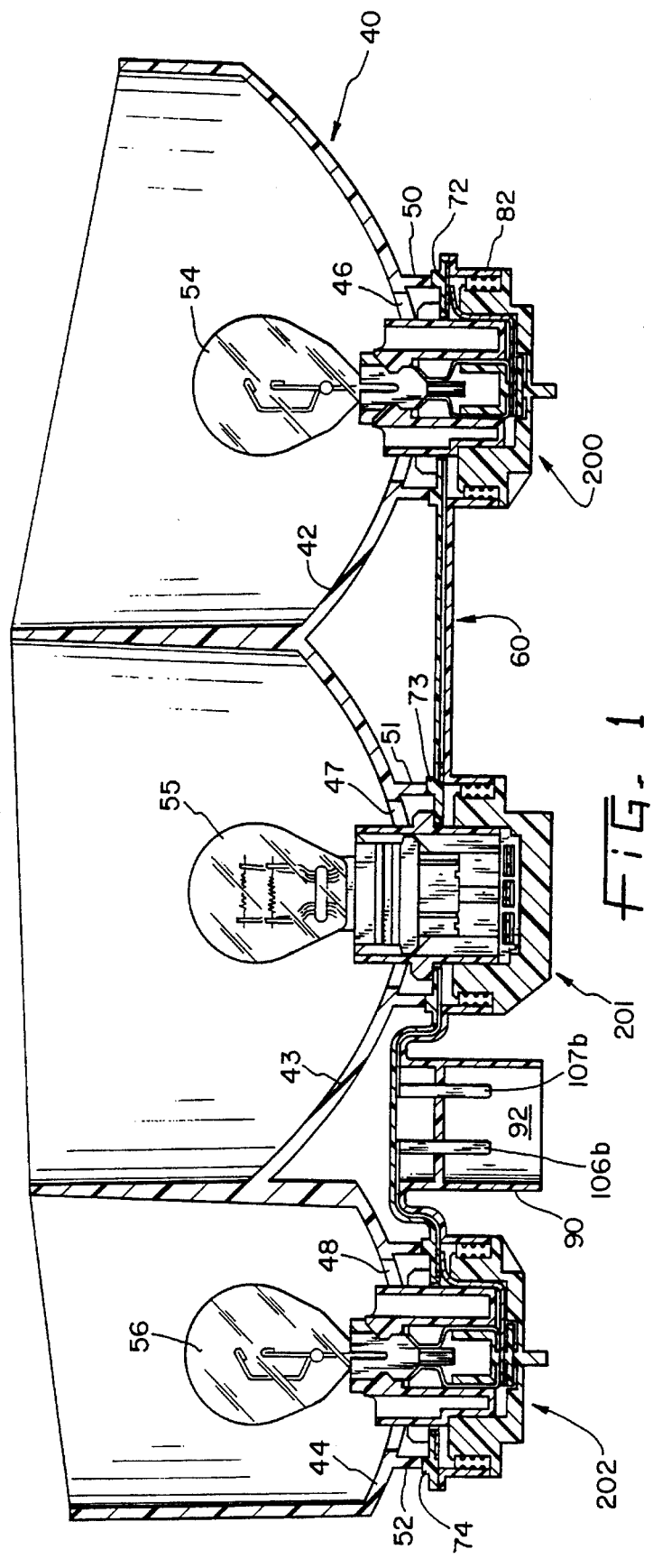
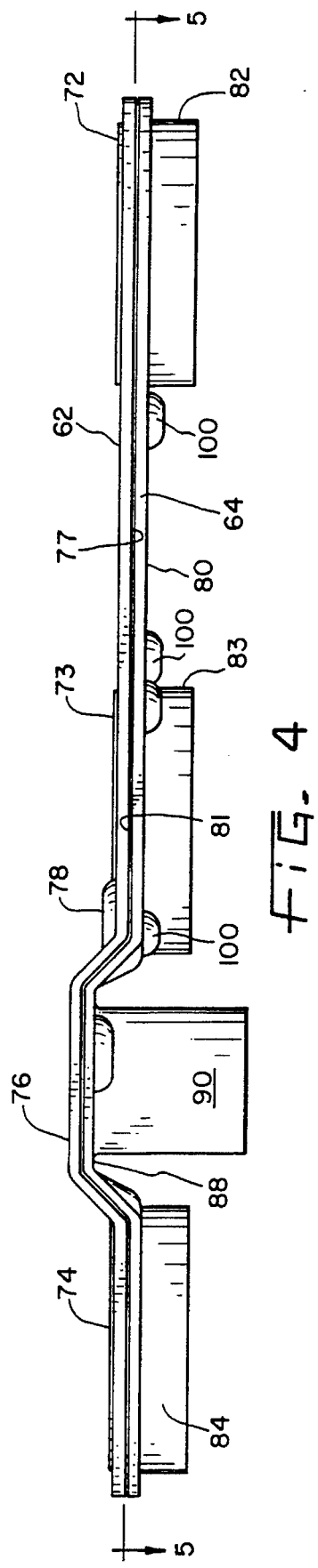

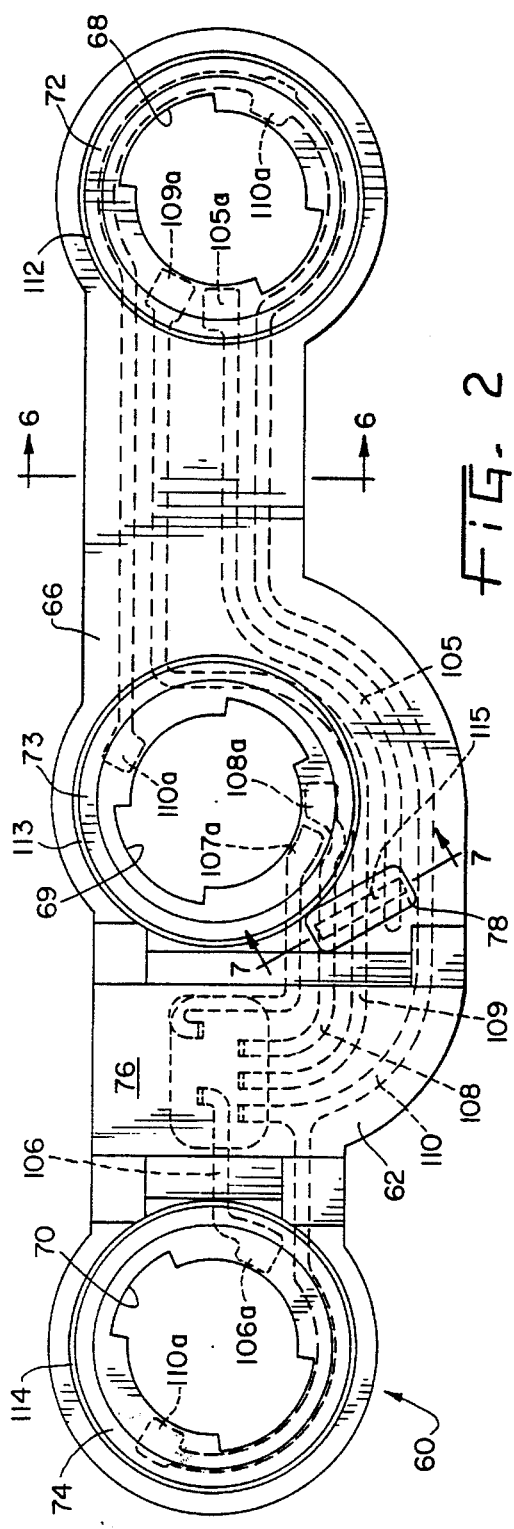
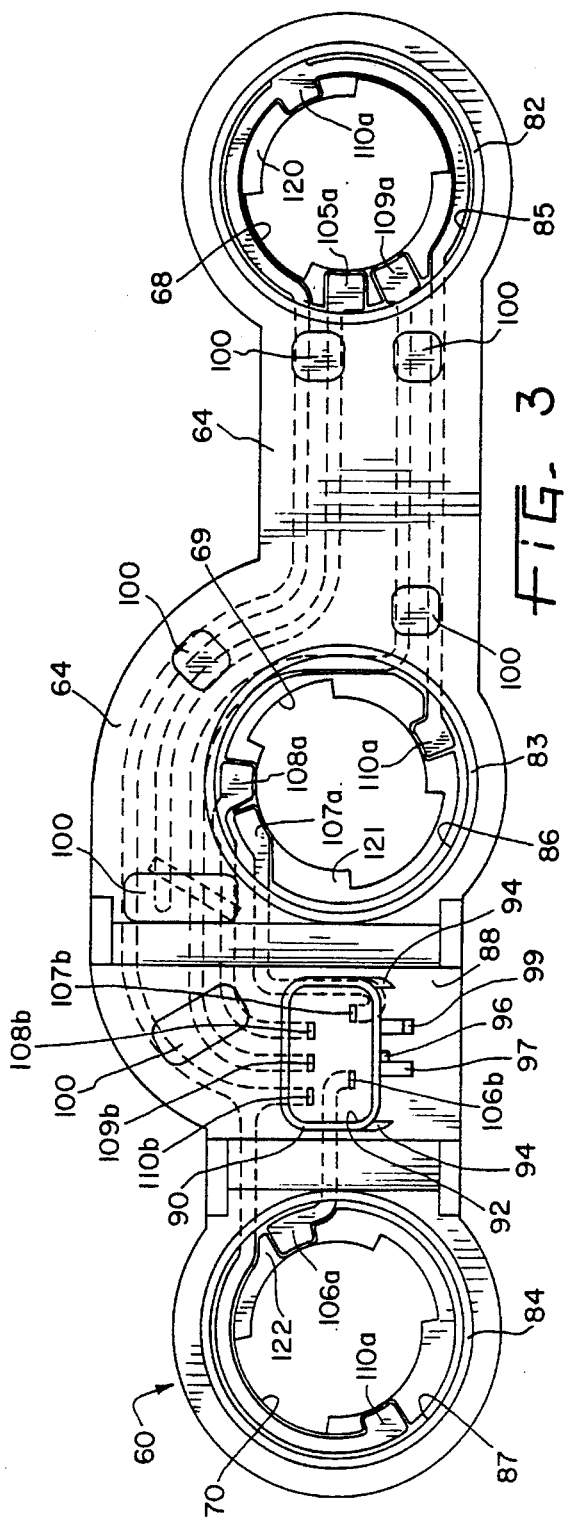

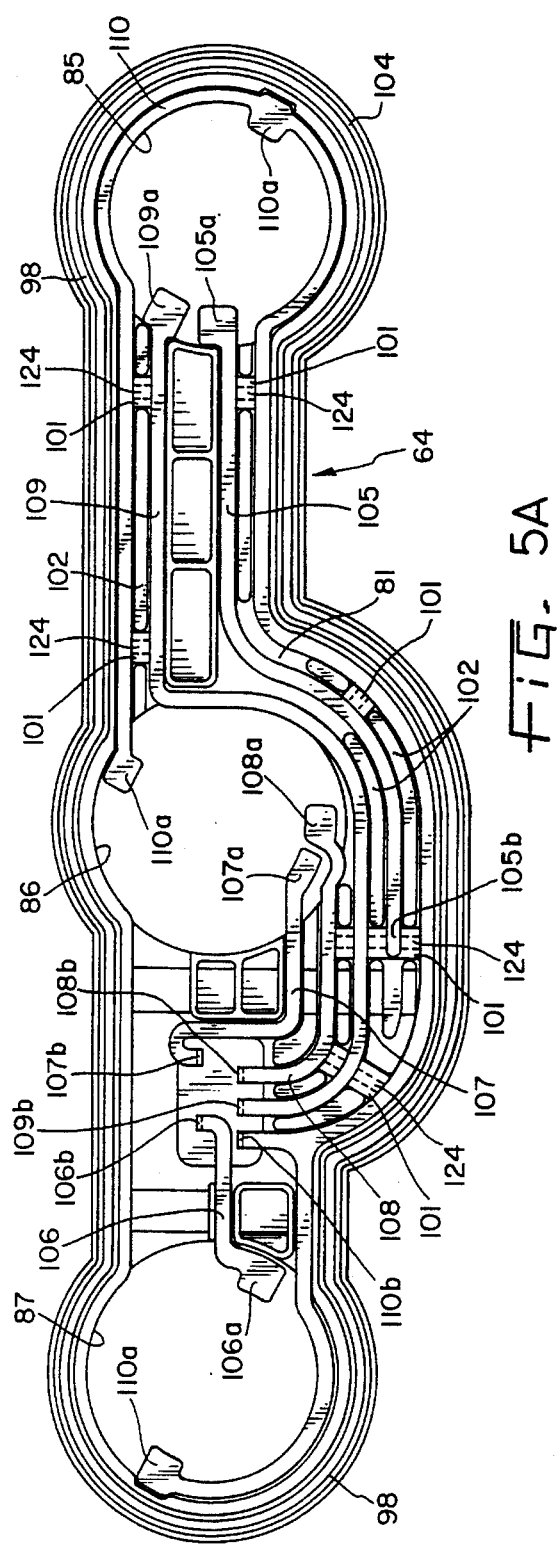
FIG. 5A
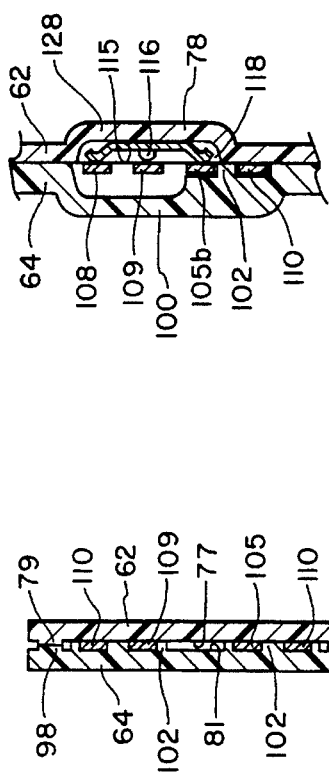
FIG. 7
FIG. 6

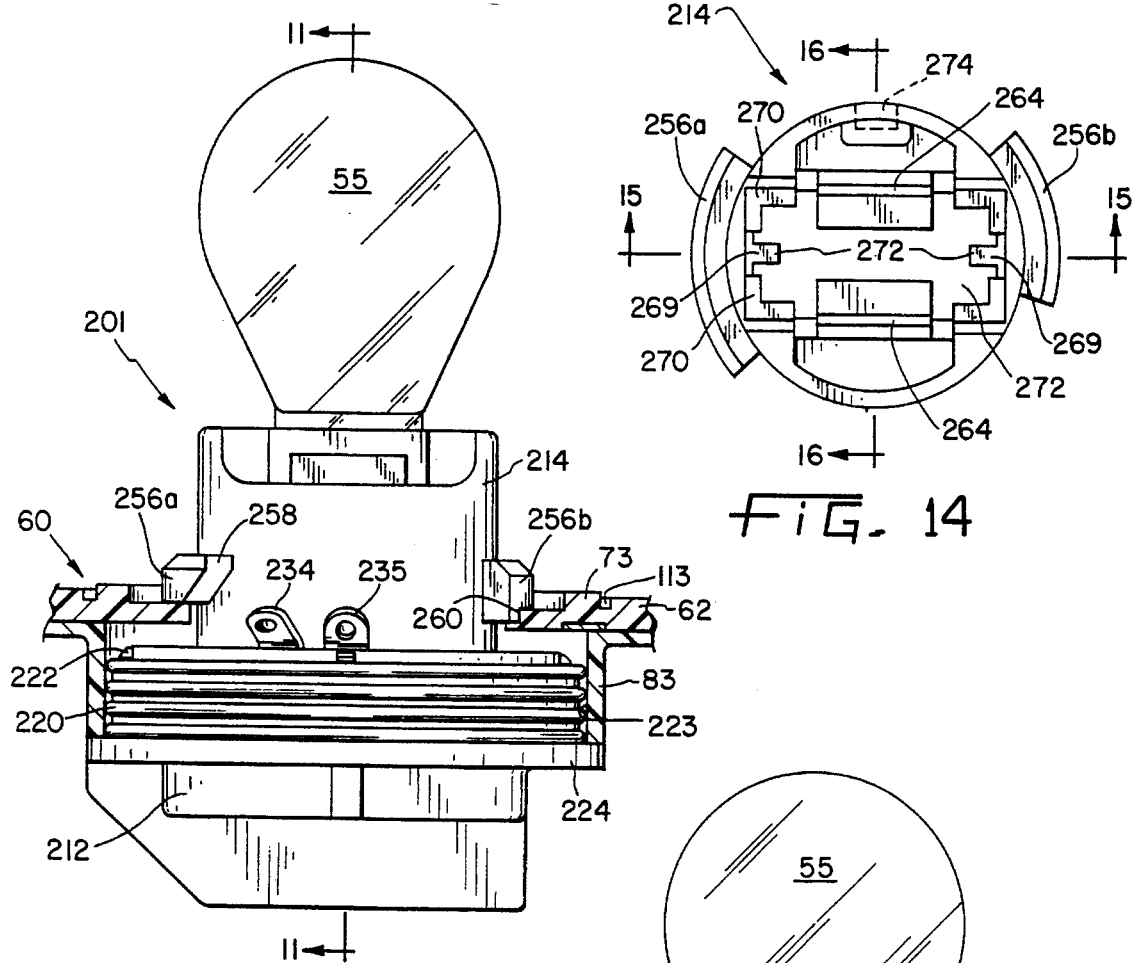
FIG. 9
FIG. 14
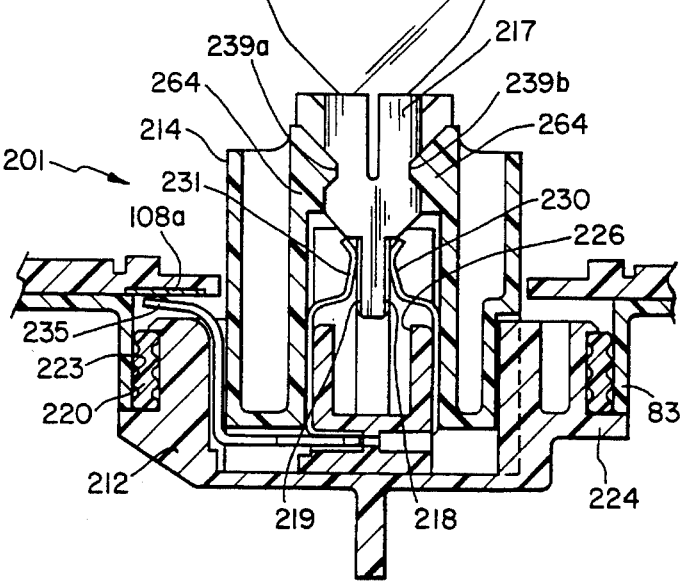
FIG. 11

LAMP SOCKET AND BACKPLATE ASSEMBLY AND METHOD OF MAKING SAME

BACKGROUND OF THE INVENTION

This invention relates to lamp socket assemblies and their mounting panels, and, in particular, to lamp socket assemblies and mounting panels used in tail lights of automobiles and the like.

A number of differently configured lamp socket assemblies particularly well suited for use in tail light assemblies have been disclosed in U.S. Pat. No. 4,940,422, U.S. Pat. No. 4,958,429, U.S. Pat. No. 5,000,702, and U.S. Pat. No. 5,035,643. While these lamp sockets have proven highly successful from an operational standpoint, their assembly into vehicle requires a significant amount of time and effort for a variety of reasons.

For instance, in the past, these lamp socket assemblies were installed directly into the parabolic reflector surfaces of the lamp housing by providing keyed apertures in these surfaces. After recognizing the desirability of making the apertures in these parabolic reflector surfaces through which the lamps protrude as small as possible, a design modification was initiated. Specifically, separate keyed apertured panels were welded to the lamp housing directly behind apertures in the parabolic reflector surfaces. The purpose of the keyed aperture panels was to receive the socket assemblies. By means of this arrangement the apertures in the parabolic reflectors only needed to be large enough to accommodate a bulb. Thus while the separate panels receive the lamp socket, the bulbs themselves extended through the parabolic reflector surface. While effective, the need to provide multiple panels to which the lamp socket assemblies are be individually mounted is undesirable as it complicates assembly and therefore adds cost.

One manner of speeding assembly of tail lights has been to provide backplate assemblies which can accommodate multiple lamps. These backplate assemblies may then be electrically wired to a power source of the vehicle to provide electricity to all the lamps. Previously, a variety of backplate assemblies have been utilized in which lamp sockets were mounted to the backplate and the entire backplate assembly was fixed to the lamp housing. Seals were positioned intermediate the backplate and lamp housing to attempt to prevent moisture from reaching the lamp sockets into which the lamps were inserted.

A serious shortcoming of these designs stemmed from the fact that the lamp sockets were not removable from the backplate assembly. Consequently, whenever a lamp burned out or was otherwise inoperative, access to that lamp was provided by removing the entire backplate assembly from the lamp housing. After relamping, subsequent attempts to remount the backplate frequently tended to compromise the integrity of the seal, which in turn created the possibility of moisture reaching the lamp sockets and causing damaging corrosion.

Another shortcoming of many backplates has been that the integral circuitry was not adequately sealed within the backplate. Moisture penetrating the vehicle behind the lamp housing could then reach the circuitry and potentially impair its function.

Another type of backplate assembly which has been used, including multiple bulbs, has been a hard wired backplate assembly. In such an assembly individual wires connected the lamps and lamp sockets. This type of arrangement did not lend itself to automation and therefore tended to be costly. It is therefore desired to provide a backplate assembly which overcomes the shortcomings of the prior art backplate assemblies. Furthermore it is desired to provide a lamp socket assembly for use with a backplate assembly.

SUMMARY OF THE INVENTION

The present invention provides a [backplate assembly/lamp socket assembly/combo]for an automobile lamp assembly which facilitates the installation of the automobile lamp assembly into an automobile. The backplate assembly better allows an automobile lamp assembly to be efficiently preassembled. The preassembled lamp assembly can then be conveniently installed as a single unit into the vehicle under construction and electrically connected with a single wiring harness of the vehicle. In one form thereof, the backplate and socket assembly comprises a first substantially rigid panel which includes a plurality of first apertures and a second substantially rigid panel which includes a plurality of second apertures. The second apertures are smaller than the respective first apertures. The second apertures are aligned with the respective first apertures. A plurality of conductors are disposed between the first and second panels and are sealed therebetween. The conductors include a plurality of contact pads which extend into the first apertures. A plurality of lamp sockets are respectively disposed in the plurality of first and second apertures. Each lamp socket includes contact means for electrically contacting respective contact pads. Sealing means are provided for sealing the lamp sockets to the first panel.

One advantage of the lamp socket and backplate assembly of the present invention is that multiple lamp socket assemblies can be mounted to one backplate. Another advantage of the inventive assembly is that the electrical circuitry for multiple lamp socket assemblies can be incorporated into a single component which allows connection of all the lamp socket assemblies to the automobile wire harness with a single connector socket. Yet another advantage of the assembly is that the apertures in the reflective parabola surfaces of the lamp assembly can be minimized since only the size of the bulbs needs to be accommodated. Still another advantage of the inventive assembly is that the entire backplate and lamp unit can be manufactured as a subassembly. This entire lamp assembly can then be installed on the automobile production line with the only electrical connection to be made by means of a socket which plugs into the backplate assembly. A further advantage of the inventive assembly is that the electrical circuitry within the backplate housing is sealed from moisture to prevent damage to the circuitry. A still further advantage of the inventive assembly is the rigidity of its housing and internal circuitry imparts durability thereto. A yet still further advantage of the inventive backplate assembly is its ability to be sealed to a lamp housing to protect the mounted lamp socket assemblies. Another advantage of the assembly of the present invention is that electrical connection of the lamp sockets to the backplate assembly occurs automatically during their installation to the backplate assembly. Still another advantage of the inventive assembly is that the lamp sockets cooperatively seal with the backplate assembly to prevent moisture from penetrating the circuitry of either assembly.

BRIEF DESCRIPTION OF THE DRAWINGS

The above-mentioned and other advantages and objects of this invention, and the manner of attaining them, will become more apparent and the invention itself will be better understood by reference to the following description of embodiments of the invention taken in conjunction with the accompanying drawings, wherein:

FIG. 1 is a diagrammatic front view of the sealed backplate assembly of the present invention, shown in cross-section, installed in a lamp housing and wherein three lamp socket assemblies of the present invention are shown in cross section mounted to the backplate assembly;

FIG. 2 is a top view of the backplate assembly of FIG. 1 prior to installation in the lamp housing and without the associated lamp socket assemblies;

FIG. 3 is a bottom view of the backplate assembly of FIG. 2;

FIG. 4 is a front elevational view of the backplate assembly of FIG. 2;

FIG. 5A is a top view of the backplate assembly, as taken along line 5—5 of FIG. 4, wherein the upper body panel has been removed for purposes of illustration;

FIG. 6 is a side view in cross section of the backplate assembly taken along line 6—6 of FIG. 2;

FIG. 7 is a partial side view in cross section of the backplate assembly taken along line 7—7 of FIG. 2 illustrating the circuitry bridging shunt;

FIG. 9 is a front elevational view of an assembled lamp socket assembly of the present invention installed in a partially shown sealed backplate assembly;

FIG. 11 is a cross-sectional view of the assembled lamp socket assembly, taken along line 11—11 of FIG. 9, installed on the partially shown sealed backplate assembly;

FIG. 14 is a top plan view of the socket assembly body;

Figure 5B:
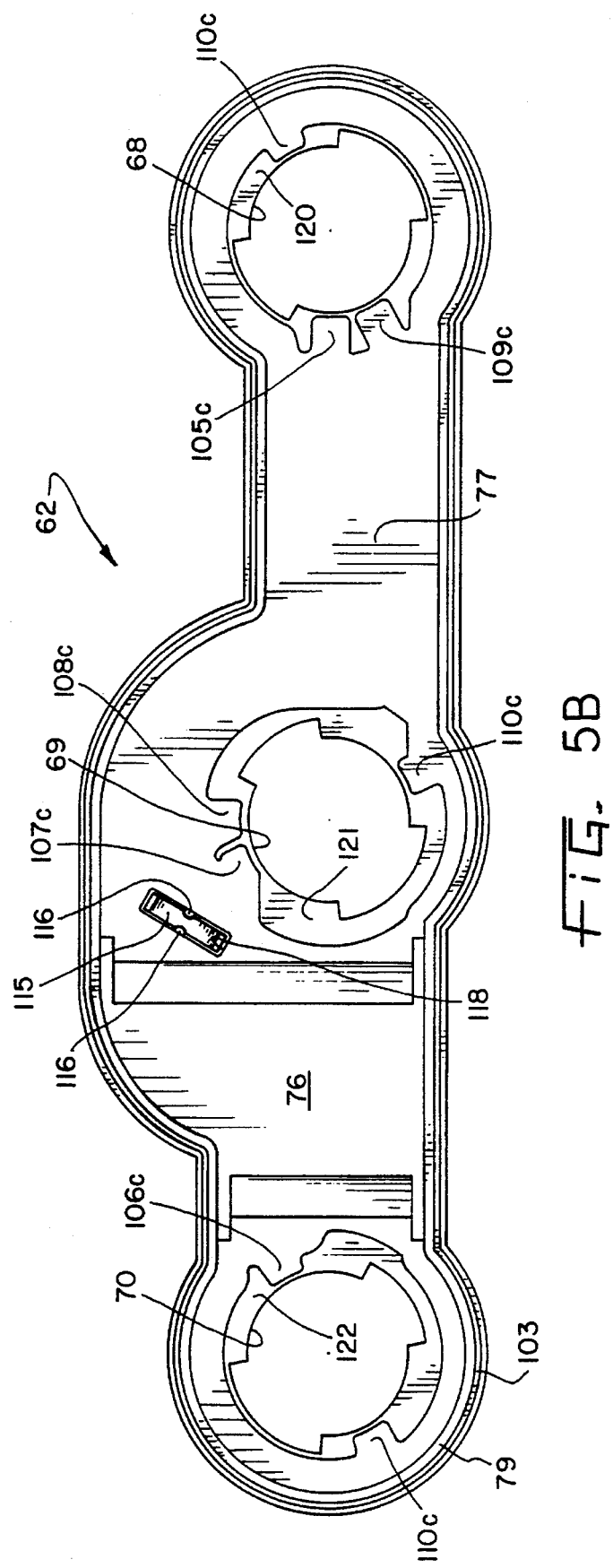
FIG. 5B is a bottom view of the upper body panel.

Corresponding reference characters indicate corresponding parts throughout the several views. Although the drawings represent an embodiment of the invention, the drawings are not necessarily to scale and certain features may be exaggerated in order to better illustrate and explain the present invention.

DESCRIPTION OF THE PREFERRED EMBODIMENT

The various embodiments disclosed below are not intended to be exhaustive or limit the invention to the precise forms disclosed in the following detailed description. Rather, the embodiments are chosen and described so that others skilled in the art may understand their teachings.

Referring now to FIG. 1, a sealed backplate assembly of the present invention, diagrammatically shown in cross-section and generally designated 60, is operationally assembled with lamp housing 40. Backplate assembly 60 is equipped with three cross sectionally shown lamp socket assemblies of the present invention, generally designated 200, 201, and 202 and which are respectively provided with lamps 54, 55 and 56. For purposes of clarity of illustration all details of the lamp socket assemblies have not been shown in this representation. The configuration of lamp housing 40 shown is suitable for use as a tail light assembly, and lamp socket assemblies 200, 201, and 202 serve illumination purposes during braking, turn signal activation, and backing up operations, respectively.

Lamp housing 40 includes parabolic reflective surfaces 42, 43, 44 which are provided with centrally disposed openings 46, 47, 48 through which lamps of lamp socket assemblies 200, 201 and 202 protrude. Extending downwardly from surfaces 42–44 are weldable plastic annular projections 50–52. Lamp housing 40 also includes covering lenses (not shown) which sealingly enclose the bulbs within lamp housing 40 and which are appropriately colored for the intended operation of the enclosed lamp socket assemblies.

Referring now to FIGS. 2–4, 5A and 5B, sealed backplate assembly 60 includes the circuitry for electrically interconnecting the three lamp socket assemblies 200–202 and for connecting the backplate assembly to the automobile wire harness with only a single socket connector. In the disclosed embodiment, the sealed external housing of backplate assembly 60 is formed by upper body panel or cover 62 and a complementarily shaped lower body panel or base 64 which are preferably shell halves formed from a rigid insulative material. Body panels 62, 64 are molded from an electrically insulative plastic material such as a suitable plastic material and are subsequently interconnected with the electric circuitry of the unit sealingly encapsulated therebetween. Despite the fact that the backplate assembly is generally vertically oriented and directed rearwardly from a car when employed with a tail light assembly, body panel 62 is characterized as an upper panel herein and body panel 64 is characterized as a lower panel herein to facilitate explanation, and subsequent usage of upper and lower, as well as upward and downward and the like, is consistent with this characterization.

As shown in the top view of FIG. 2, upper body panel 62 includes an upward facing outer surface 66 and is provided with keyed apertures 68, 69, 70 therethrough shaped to operatively receive locking lugs of lamp socket assemblies 200, 201, 202. Keyed apertures 68–70 are disposed at various radial orientations within upper body panel 62 as required for the desired filament radial orientation. The shown aperture orientations are coordinated with the locations of the electrical contact pads shown in dotted lines proximate each keyed aperture, such that identical lamp socket assemblies can be used for each lamp socket assembly 200–202. Outer surface 66 is generally planar in overall configuration but may include an upwardly offset region 76 better shown in FIG. 4. To minimize over-all profile size outer surface 66 also includes upwardly projecting annular weld beads 72, 73, 74 and raised shunt housing 78. Weld beads 72–74 ring keyed apertures 68–70 respectively and in turn are ringed by melt grooves 112, 113, 114 in surface 66. Melt grooves 112–114, which offset weld beads 72–74 to increase the effective height of weld beads 72–74, also serve as reservoirs or flash traps for the weld flash when weld beads 72–74 are melted. When backplate assembly 60 is finally assembled, weld beads 72–74 are secured by welding to annular downward projections 50–52 of lamp housing 40 to operationally mount sealed backplate assembly 60 as shown in FIG. 1. Such welding achieves an effective seal and prevents entry of moisture external to housing 40 and present at upper body panel 62 from entry into housing 40 and reaching lamp socket assemblies 200–202.

As shown in FIGS. 3 and 4, lower body panel 64 has a downward facing outer surface 80 which includes downwardly projecting cylindrical sleeves 82, 83, 84 which have inner surfaces structured to sealingly cooperate with axial seals (not shown) of the lamp socket assemblies 200–202. Cylindrical sleeves 82–84 define circular openings 85, 86, 87 (See FIG. 5) through lower body panel 64 which are oriented to be axially aligned with upper body panel keyed apertures 68–70. As circular openings 85–87 are of a larger diameter than apertures 68–70, portions 120, 121, 122 of the inner surface of upper body panel 62 and portions of the electrical conductors 105–110 and most particularly contact pads 105a–110a, are exposed. This exposure allows for an electrical interconnection with the terminals of the lamp socket assemblies 200–202 as described further below.

Upwardly offset region 88 of lower body panel 64 is provided with a downwardly extending connector socket 90 having an interior cavity 92 into which stamped circuitry blade terminal ends 106b–110b extend as represented in FIGS. 1 and 3. It will be appreciated that the provision of offset regions 76, 88 results in a lower assembly profile, as connector socket 90 does not extend downwardly as far as would be necessary without the provision of the offset regions. Consequently, backplate assembly 60 requires less space for installation. Connector socket 90 is preferably provided with suitable components such as alignment flanges 94 for aligning a mating electrical connector (not shown). Connector socket 90 also includes a primary locking tab 96 and secondary locking tabs 97, 99 to secure connector socket 90 to a mating connector (not shown). The mating electrical connector (not shown) includes connector terminals for connecting blade terminal ends 106b–110b with the wiring harness of the automobile. A number of protuberances 100, which define cavities 101 shown in FIG. 5A on the lower body panel upward surface 81, project downwardly from lower body panel 64.

Referring now to FIG. 5A, lower body panel 64 is shown in top view with upper body panel 62 removed. The inner or upper surface 81 of lower body panel 64 includes a projecting weld bead or ridge 98 which extends continuously around the entire perimeter of panel 64. The inner or lower surface 77 of upper body panel 62 similarly includes weld bead 79 (See FIG. 5B) arranged continuously around its entire perimeter and which is aligned with weld bead 98.

Grooves 103 and 104 are respectively provided in panels 62, 64 around weld beads 79, 98 to serve as weld flash traps and thereby prevent flash from welding beads 79, 98 from spilling over the circuitry or the outer sides and surfaces of the backplate housing. Variously shaped ribs 102 are also provided on inner surface 81 to substantially define tracks into which stamped conductors 105–110 are placed during assembly. Ribs 102 are provided with upwardly extending staking posts (not shown) which are staked during the assembly process to ensure that conductors 105–110 remain in their tracks prior to connection of panels 62 and 64. Referring to FIG. 3, the inner surface portion of upper body panel 62 which surrounds each keyed aperture 68–70 includes a projecting pad locating template 120–122. Templates 120–122 each define recesses which are appropriately sized and arranged to positively locate their respective contact pads 105a–110a of conductors 105–110.

Referring now to FIG. 5B, upper body panel 62 is shown in bottom view with lower body panel 64 removed. The lower or inner surface 77 of upper body panel 62 includes a projecting weld bead or ridge 79 which extends continuously around the entire perimeter of panel 62. This weld bead, upon assembly of panels 62 and 64, is aligned with weld bead 98 of lower panel 64. Groove 103 is provided around weld bead 79 to service a weld flash trap and thereby prevent flash from welding bead 79 from spilling over the circuitry or the outer sides of the backplate housing. Heat apertures 68, 69, 70 are provided. Located around apertures 68–70 are slightly recessed areas 105c, 106c, 107c, 108c, 110c for receiving the ends 105a–110a of conductors 105–110. Additionally, the areas of the lower surface of upper panel 62 which are exposed after assembly of panels 62 and 64 indicated at 120, 121, 122.

Panel 62 is also provided with a shunt housing 78 which defines a cavity 118 in which shunt 115 is located. Shunt 115 is maintained in place, before assembly of panels 62 and 64, by means of protuberances 116 which have an interference fit with shunt 115.

Sandwiched between upper and lower body panels 62, 64 is the electrical circuitry allowing for the selective energization of lamp socket assemblies 200–202. The disclosed electrical circuitry is formed of stamped conductors 105–110 which may be shaped and arranged as best shown in FIG. 5A. Other circuit configurations are also possible within the scope of the invention. Conductors 105–110 are stamped from a thin sheet of electrically conductive material, preferably tin coated steel, and are formed to closely conform to the tracks of lower panel 64 to form electrical conductors between panels 62 and 64. This stamping process produces rigid conductors in a relatively economic manner. Conductor 110 is advantageously employed as a ground circuit common to each lamp socket assembly 200–202 and therefore includes an electrical contact pad 110a extending from conductor 110 into each opening 85–87. Contact pads 110a, which are generally rectangular extensions of component 110 but could be otherwise shaped, as well as the additional contact pads identified further hereinbelow, serve as an enlarged surface area to ensure a proper electrical connection with the terminals of lamp socket assemblies 200–202 when the lamp socket assemblies are inserted into the backplate 60. Blade terminal end 110b (See FIG. 3) of component 110 is orthogonally disposed with respect to the plane of conductor 110, passes through an opening in lower body panel 64, and projects into socket cavity 92.

The remaining conductors 105–109, unlike conductor 110, provide electrical communication with fewer than all the lamp socket assemblies. Conductor 106 extends from contact pad 106a which projects into opening 87 to blade terminal end 106b which projects into socket cavity 92. Conductor 107 extends from contact pad 107a which extends into opening 86 to blade terminal end 107b which projects into socket cavity 92. Conductor 108 extends from contact pad 108a which projects into opening 86 to blade terminal end 108b which projects into socket cavity 92. Conductor 109 extends from contact pad 109a which projects into opening 85 to blade terminal end 109b which projects into socket cavity 92. Conductor 105 extends from contact pad 105a which projects into opening 85 to end 105b which does not extend into socket cavity 92. When upper body panel 62 and lower body panel 64 are secured together during assembly, the electrical conductors 105–110 are securely maintained within their tracks as represented in the cross-sectional view of FIG. 6 by the close fit of panels 62, 64.

End 105b of conductor 105 is electrically connected via an electrical cross-over or shunt 115 to conductor 108. As shown in the cross-sectional view of FIG. 7 taken along line 7—7 of FIG. 2, shunt 115 bridges conductor 109. Consequently, when a voltage is provided to blade terminal end 108b to thereby energize contact pad 108a, contact pad 105a is also energized. This common energization is desirable as both lamp sockets will be simultaneously energized whereby two tail lights are energized simultaneously. Shunt 115 is secured to upper body panel 62 within an interior cavity 118 defined by shunt housing 78 by means of an interference fit with two small projections 116 within cavity 118. Shunt 115 may be stamped from tin plated steel in a manner similar to the construction of conductors 105–110. After assembly of panels 612 and 64 shunt 115 is positively engaged with conductors 105 and 108 and secured in its position as shown in FIG. 7.

Figure 8:
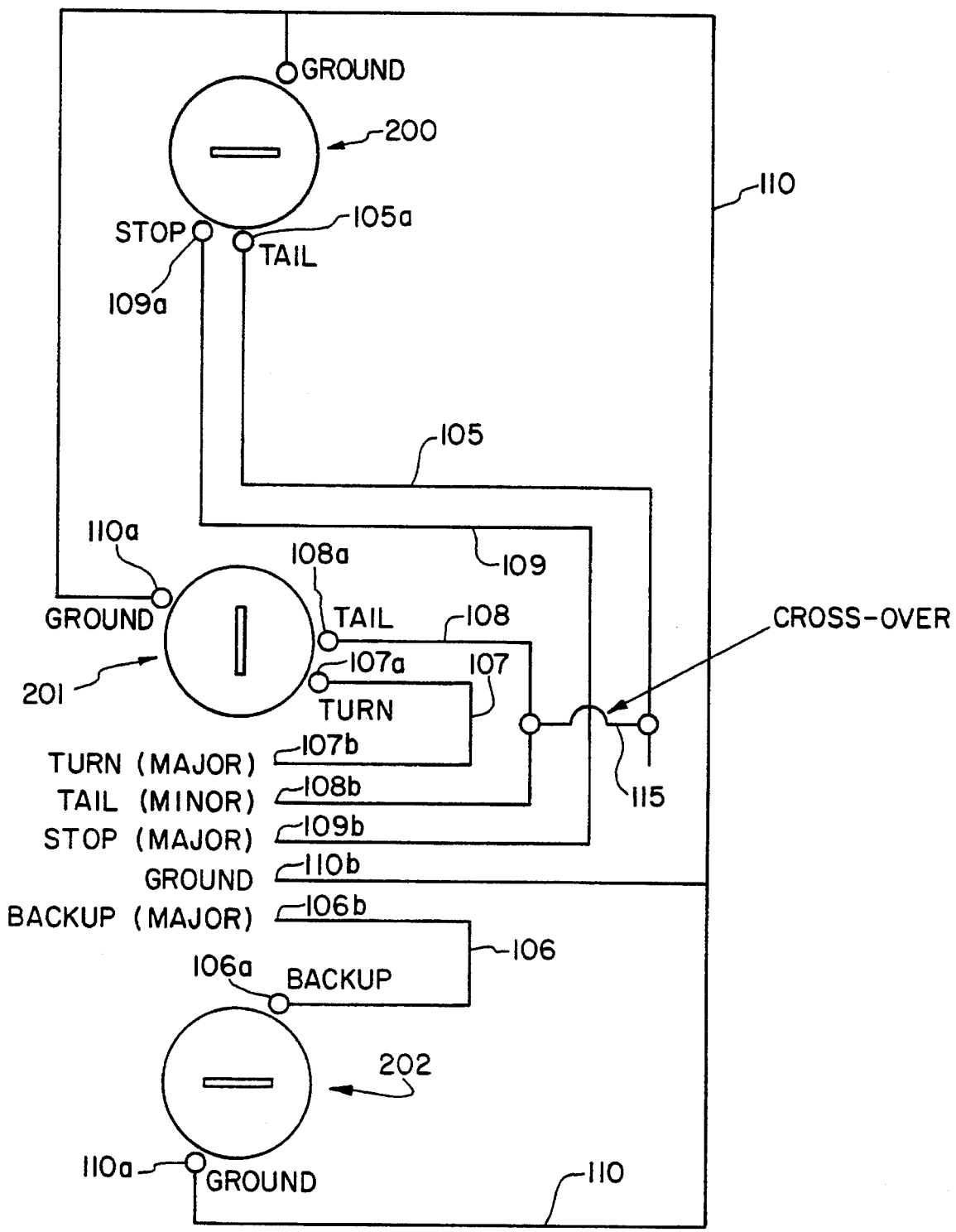
FIG. 8 is a wiring diagram for the backplate assembly of the present invention.

The presence and positioning of contact pads 105a–110a is selected in conjunction with the configuration of the electrical terminals 233, 234, 235 of lamp socket assemblies 200–202 to provide the electrical circuits represented in the wiring diagram of FIG. 8. The lamps 54–56 of lamp socket assemblies 200, 201 each utilize two independent filaments, namely a major filament and a minor filament to which the parenthetical descriptions major and minor refer in FIG. 8, in order to provide both an illuminated tail light when the vehicle's driving lights are energized and either an illuminated braking signal or an illuminated turn signal. The tail lights are interconnected with the minor filament in this embodiment. While only a single filament is utilized in lamp 56 of lamp socket assembly 202, the same type of lamp and lamp socket assembly including both major and minor filaments is provided for lamp socket assembly 202. The major filament of lamp 56, rather than the minor filament, is electrically utilized in lamp socket assembly 202.

For the lamp socket assembly electrical terminals 233, 234, 235 described further below, the ground circuit terminals and the major circuit terminals 234 are substantially diametrically opposed. Consequently, in order that lamp socket assemblies 200–202 may be properly electrically connected with the backplate assembly conductors for each keyed aperture 68–70, a grounded contact pad 110a is disposed substantially opposite contact pads 109a, 107a, and 106a, respectively. Contact pads 105a and 108a, which engage the minor circuit terminals, are disposed around keyed apertures 68 and 69 respectively at a radial offset of about 27.75° from major circuit contact pads 109a and 107a. The radial offset of 27.75° is dictated by the bulb dimension and the desire to have the electrical terminals 233–235 of the socket assembly extend radially outwardly from the center of the lamp socket assembly.

Referring now to FIGS. 1–4, 5A and 5B, sealed backplate assembly 60 is constructed and assembled as follows. Upper body panel 62 and lower body panel 64 are molded separately of suitable plastic material. Conductors 105–110 are stamped using any suitable stamping process. In a preferred construction process, conductors 105–110 are all simultaneously stamped from a single sheet of tin coated steel. In addition, conductors 105, 108, 109 and 110 are integrally formed and are interconnected as the stamping process leaves a number of tie bars 124, shown in dashed outline in FIG. 5A, which span and interconnect the conductors. Tie bars 124 are arranged at locations along conductors 105, 108, 109 and 110 such that the tie bars span cavities 101 in lower body panel 64 when the conductors are initially installed in lower body panel 64. In the disclosed embodiment, conductors 106 and 107 are not formed so that they are interconnected and integral with conductors 105, 108, 109 and 110 as the construction of blade terminal ends 108b, 109b, and 110b requires utilization of a portion of the sheet material from which circuitry components 106 and 107 would otherwise be formed. Shunt 115 may also be formed by a stamping operation.

After fabrication the conductors are assembled into lower panel 64 of backplate assembly 60. Shunt 115 is secured by friction fit within the internal cavity 118 of shunt housing 78. After insertion within the various tracks provided on inner surface 81 such that blade terminal ends 106b–110b extend into socket connector 90, conductors 105–110 are secured to lower body panel 64 and more particularly inner surface 81 by a suitable staking process. After securement, tie bars 124 which interconnect conductors 105, 108, 109 and 110 are sheared and bent into hollows 101. The shearing and bending eliminates undesired shorts between the circuitry and prevents portions of tie bars 124 from floating around inside finished assembly 60.

After installation of conductors 105–110, upper body panel 62 is welded to lower body panel 64. Conductors 105–110 are thereby sealed between panels 62 and 64. In particular, using a hot plate welding technique known in the art, a heated platen which has a shape corresponding to weld beads 79 and 98 is situated between upper body panel 62 and lower body panel 64. Panels 62, 64 are then pressed against the heated platen until a portion approximately 0.015 inches of each of the weld beads 79, 98 in the disclosed embodiment is melted down and displaced. During this melting process, the displaced flash of each weld bead spreads laterally to partially fill in the adjacent grooves 103, 104. After panels 62, 64 are subsequently moved apart and the heated platen removed, panels 62, 64 are realigned and squeezed together such that the still soft weld beads 79, 98 are further compressed together. In the disclosed embodiment, this further compression reduces the total thickness of the combined weld beads 79, 98 by about another 0.030 inches. The amount of compression of the panels upon hot plate welding is dependent on the equipment which is used and the amount of compression which is specified by the manufacturer of that equipment. It will be appreciated that because weld beads 79, 98 extend around the entire perimeter of panels 62, 64, a moisture impervious seal which results from the melting together of beads 79, 98 is produced around the connections between plate 62, 64. Electrical conductors 105–110 are thereby protected from exposure to the elements.

After interconnection of plates 62 and 64 backplate assembly 60 can be secured to lamp housing 40. The preferred method of securement may also utilize hot plate welding. Annular projections 50–52 of lamp housing 40 are sealingly secured by welding to annular weld beads 72–74 positioned on outer surface 66 of upper body panel 62. It will be appreciated that while an upper body panel 62, separate and distinct from lamp housing 40 which mates with lower body panel 64 is disclosed herein, it is within the scope of the invention to form upper body panel 62 integrally with lamp housing 40. Sealed backplate assembly 60 is now prepared for insertion of lamp socket assemblies 200–202.

Referring to FIGS. 9 and 11, there are respectively shown a front view and a side cross-sectional view of the preferred embodiment of lamp socket assembly 201 operationally installed to partially shown backplate assembly 60. Lamp socket assembly 201 is shown in top view in FIG. 10 with the lamp removed and without the backplate assembly. Lamp socket assembly 201 is similar in many respects to the lamp socket assembly described in U.S. Pat. No. 5,035,643, assigned to the assignee of the present invention, which description is incorporated herein by reference. While referencing assembly 201, the following lamp socket assembly explanation also has equal application to assemblies 200 and 202, which are identical to assembly 201. Lamp socket assembly 201 includes a base or housing 212, a body 214, a lamp 55, a contact insert 226 captured within body 214 and provided with contacts 228, 229, 230, 231, and terminals 233, 234, 235 for electrical interconnection of the contacts with the contact pads 105a–110a of backplate assembly 60 as described further below. When backplate assembly 60 is installed as shown in FIG. 1, and when lamp socket assembly 201 is fully inserted into and locked within one of keyed apertures 68, 69, 70, lamp 55 projects within the sealed tail light assembly as shown.

Lamp 55, which forms no part of the present invention, is shown in FIG. 1 as a two-filament lamp which is utilized to provide illumination for different circumstances as described above. As best shown in FIG. 11, lamp 55 includes a lamp base 217 which is axially inserted into lamp socket assembly 201. Lamp base 217 is provided with two pairs of contact wires 218, 219 connected to the major and minor filaments. Lamp base 217 includes transversely extending grooves 239a and 239b which are utilized for retaining lamp 55 in an operational position within lamp socket assembly 201.

A ribbed axial seal 220 made from an elastomeric material such as silicon rubber is circumferentially disposed around a cylindrical portion of housing 212. Axial seal 220, which is seated on a radially extending mounting flange 224 of housing 212 and is axially retained by four radially extending prongs 222 spaced at 90° intervals, engages the inner surface 223 of cylindrical sleeve 83 to provide a moisture impermeable seal between lamp socket assembly 201 and backplate assembly 60 to prevent passage of moisture from the atmosphere into the interior of lamp housing 40. The ribs of seal 220 ensure a positive seal with backplate assembly 60. By preventing moisture from reaching the electrical components of lamp socket assembly 201 and the electric components within backplate assembly 60, the assembly is sealed and corrosion of the electrical components is prevented.

Figure 10:
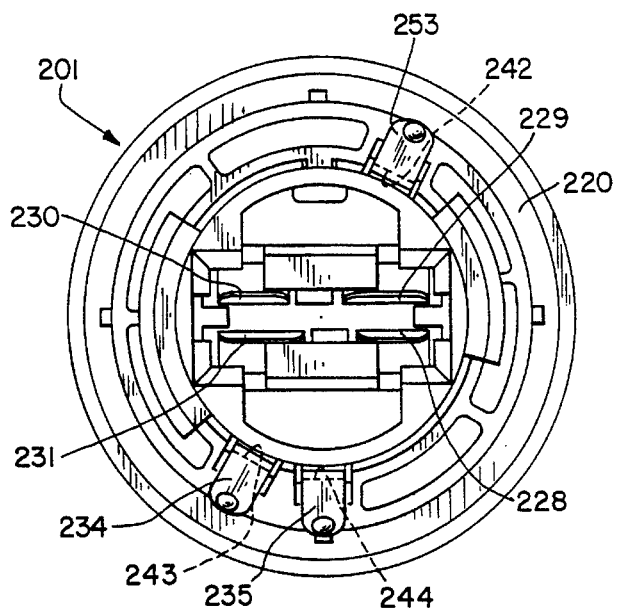
FIG. 10 is a top plan view of the lamp socket assembly of FIG. 9 removed from the backplate assembly and with the lamp bulb not shown.
Figure 12:
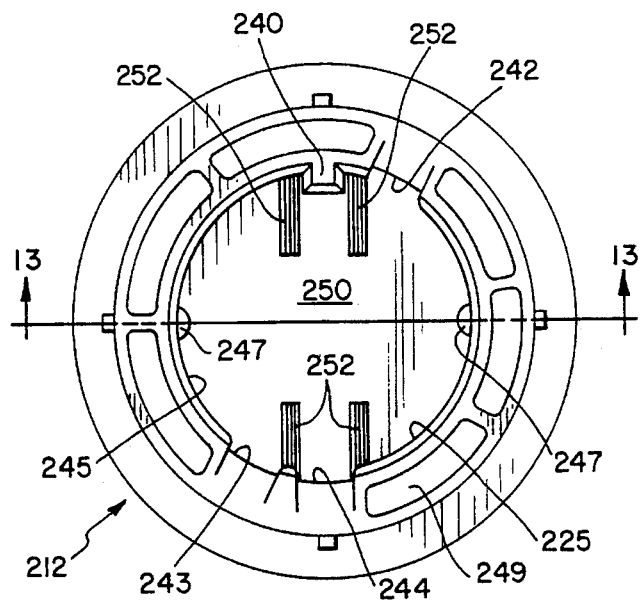
FIG. 12 is a top plan view of the socket assembly housing with the associated axial seal removed for purposes of illustration.
Figure 13:
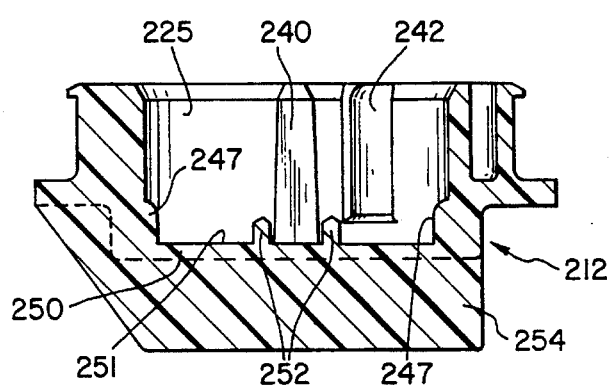
FIG. 13 is a cross-sectional view of the housing taken along line 13—13 of FIG. 12.

Referring now to FIGS. 12 and 13, housing 212 is illustrated in a top view and a cross-sectional view, respectively. Housing 212 includes a central socket cavity 225 which is generally cylindrical in shape and in which contact insert 226 and body 214 are received. Housing 212 includes key 240 which projects radially inwardly into cavity 225 and is used for properly orienting body 214 with regard to housing 212 during assembly. Housing 212 further includes three recesses 242, 243, 244 which open into cavity 225 and which are formed into the housing inner radial wall 245 of housing 214 which defines cavity 225. As shown in FIG. 10, recesses 242–244 respectively accommodate terminals 233, 234, 235 which are employed as the ground, major, and minor electrical circuit contacts. A pair of contact insert keys 247 are also provided in cavity 225 to properly locate contact insert 226 in cavity 225. Arcuate cavities 249 in housing 212 ensure that a constant wall thickness is maintained and reduce the plastic consumption of housing 212 without compromising its rigidity or operation.

Preferably provided on the upper, interior surface of bottom wall 250 of socket cavity 225 are a plurality of energy directors or ribs 252. Energy directors 252, which include triangular configured top surfaces, extend axially upwardly in cavity 225 from bottom wall 250 of the cavity. Energy directors 252 as shown ensure proper securement of body 214 to housing 212 when attachment by means of sonic welding is employed. As best seen in FIGS. 9, 11 and 13, axially projecting downwardly from housing 214 is a flange 254 which can be used as a grip for rotating lamp socket assembly 201 during its insertion and extraction.

Figure 15:
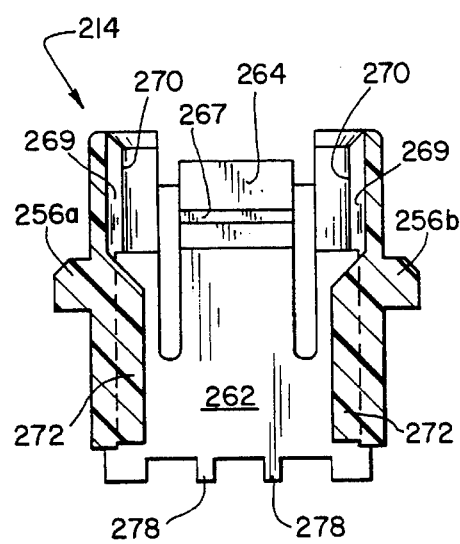
FIG. 15 is a cross-sectional view of the body taken along line 15—15 of FIG. 14.
Figure 16:
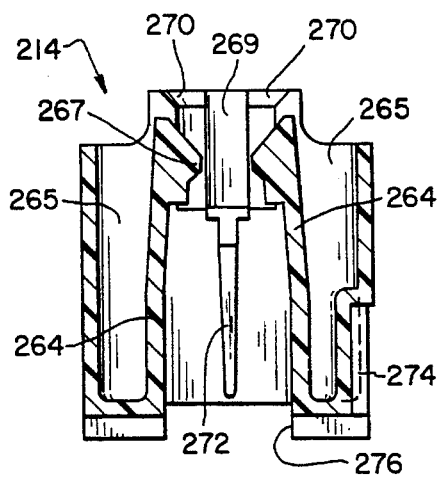
FIG. 16 is a cross-sectional view of the body taken along line 16—16 of FIG. 14.

Body 214 is more particularly shown in FIGS. 14–16. The exterior surface of body 214 includes radially projecting locking lugs 256a and 256b. Locking lugs 256, which are positioned around body 214 at angular orientations corresponding to the configuration of keyed apertures 68, 69, 70 in backplate assembly 60, are used to install and lock lamp socket assembly 201 to backplate assembly 60. It will be appreciated that lugs 256 could be formed by axial projections of housing 212. Moreover, while camming lugs are preferred, other means for installing assembly 201 to backplate assembly 60, including the use of resilient fingers on one part for engaging complementary grooves in the other part, are within the scope of the invention. Locking lugs 256a and 256b are keyed such that socket assembly 201 cannot be inserted incorrectly during securement to backplate assembly 60. Each locking lug 256a and 256b includes a camming surface 258, and locking lug 256b includes a downwardly extending stop shoulder 260 at its trailing end for abutting with an exposed portion of upper body panel 62 in aperture 87 as best shown in FIG. 9. Camming surfaces 258 cam over the upper surface of upper panel 62 of backplate assembly 60 during insertion of the assembled lamp socket assembly. During this insertion, the lamp socket assembly, and in particular the snugly fitting axial seal 220, is drawn into a sleeve 82–84 such that mounting flange 224 contacts the bottom edge of one of sleeves 82–84. In this manner, backplate assembly 60 is captured between the bottom surfaces of lugs 256 and the top, annular-shaped surface of mounting flange 224. Stop shoulder 260 positively halts the rotational insertion of lamp socket assembly 200–202 at a proper rotational orientation such that terminals 233–235 are aligned with and touch contact pads 110a, 107a and 108a, respectively, as represented in FIG. 11.

Body 214 is generally cylindrical in shape and includes an axially or longitudinally aligned through passage 262 which receives both lamp base 217 and contact insert 226 during assembly of a lamp socket assembly 200–202. Body 214 is integrally fashioned with retaining fingers 264 that are resiliently hingedly connected to body 214. Retaining fingers 264, which are biased radially inwardly, can be forced radially outwardly into spaces 265. Retaining fingers 264 include projections 267 thereon which are structured to mate with and engage grooves 239a, 239b in lamp base 217 as shown in FIG. 11 to securely retain lamp 55 in lamp socket assembly 201.

Body 214 also includes a pair of diametrically opposed guide slots 269 defined by flanking shoulders 270. Guide slots 269 are bounded at their lower ends by a pair of stop ribs 272. Guide slots 269 and ribs 272 are structured complementarily to lamp base 217. Lamp base 217 includes radial protrusions on either end face (not shown) that slide within slots 269 and which abut ribs 272 in the mounted portion of lamp 55. Guide slots 269 serve to align lamp base 217 and ensure that a two-filament lamp 55 is being inserted, as a one-filament lamp typically used in other applications does not fit into guide slots 269. During insertion of lamp 55 into through passage 262, ribs 272 prevent over-insertion of lamp 55 into body 214. Body 214 also includes a key slot 274 formed in the exterior surface of the body. Key slot 274 cooperates with key 240 located in central socket cavity 225 as shown in FIG. 12 to properly orient body 214 during assembly thereof to base 212. A slot 276 as shown in FIG. 16 is provided in the bottom portion of body 214 for accommodating contact insert 226 during assembly thereof to housing 212 and body 214. Welding ribs 278 are provided on the bottom surface of body 214 for cooperating with energy directors 252 when body 214 is welded to housing 212. Welding ribs 278 are configured such that the voids or spaces defined between adjacent ribs serve as cavities in which terminals 233–235 are received.

Figure 17:
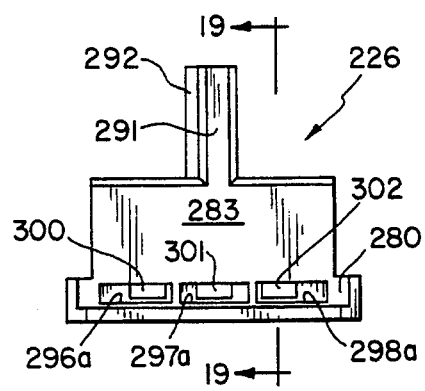
FIG. 17 is front elevational view of the contact insert of the lamp socket assembly of FIG. 9.
Figure 18:
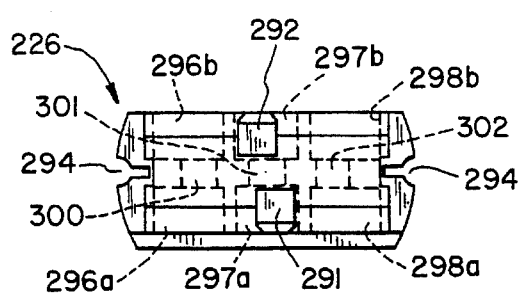
FIG. 18 is a top plan view of the contact insert of FIG. 17.
Figure 19:
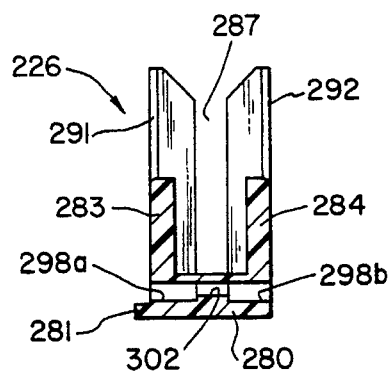
FIG. 19 is a cross-sectional view of the contact insert taken along line 19—19 of FIG. 17.

FIGS. 17–19 show contact insert 226 in front, top, and side cross-sectional views, respectively. Contact insert 226 includes a base 280 with a generally planar bottom surface. Base 280 includes a forwardly projecting flange 281, which is used to orient insert 226 properly for receiving contacts 228–231 during automated assembly of the unit. Flange 281 is designed to fit between energy directors 252 and to contact insert keys 247 to ensure proper orientation of insert 226 within housing 212. A pair of walls 283, 284 are integrally formed with base 280 and extend upwardly therefrom to form groove 287 therebetween. A pair of offset posts 291, 292 are formed integrally with and extend upwardly from base 280 and guide lamp base 217 into groove 287 therebetween. Key slots 294 are provided at either end of base 280 for cooperating with keys 247 in central socket cavity 225 of housing 212 for properly orienting contact insert 226 during assembly thereof to base 212. As best shown in shadow in FIG. 18, slots 296a, 296b, 297a, 297b, 298a, and 298b extend transversely through insert base 280 and are interconnected by cross-sectionally smaller windows 300–302. Although shown as being of generally interchangeable size, slots 296–298 are particularly designed for the contacts 228–231 to be inserted. For instance, contact 231 does not fit into slot 297b, but does fit into its assigned slot 297a. It will be appreciated that the orientation function served by flange 281 during automated assembly is important in view of the dimensional differences between slots 296–298. Windows 300–302 accommodate terminals 233–235. Housing 212, body 214, and contact insert 226 are all formed of an electrically insulative material.

Figure 21:
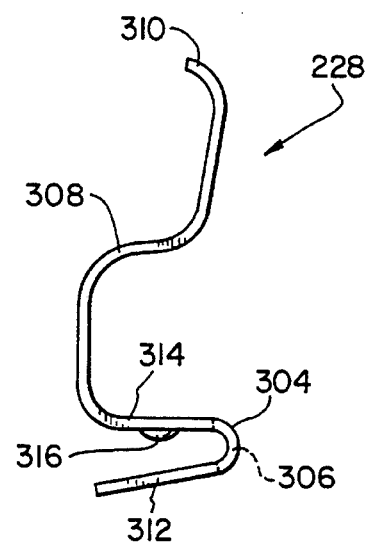
FIG. 21 is a side elevational view of the contact of FIG. 20.
Figure 20:
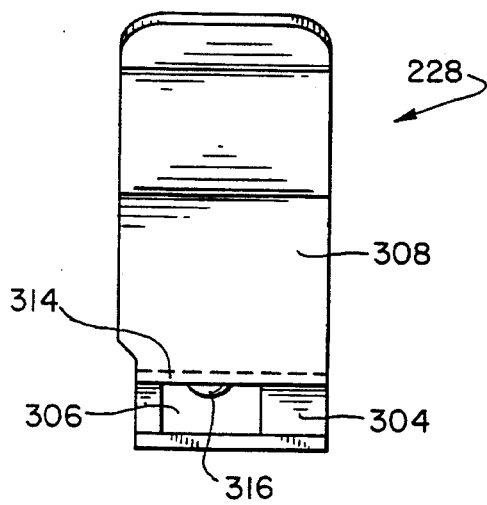
FIG. 20 is a front elevational view of a contact for the lamp socket assembly of FIG. 9.
Figure 22:
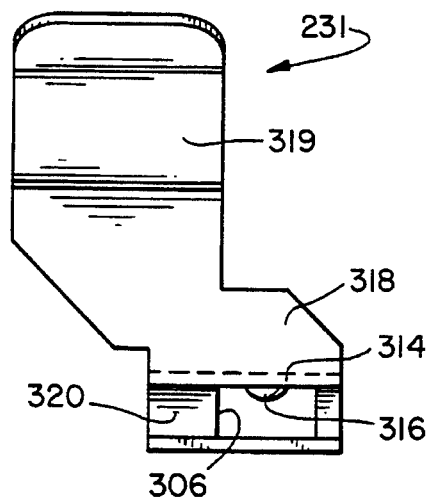
FIG. 22 is a front elevational view of another contact for the lamp socket assembly of FIG. 9.

Turning now to FIGS. 20–22, two basic types of electrical contacts are used with lamp socket assembly 201, and more particularly with contact insert 226, are illustrated. These basic types of contacts are an offset contact and a non-offset contact. Each contact, as well as each terminal described below, is constructed of a suitable conductive material such as brass. The non-offset type contact, which is used for contacts 228–230 and is illustrated in FIGS. 20 and 21, is explained with reference to contact 228. The dimensions of contacts 228–230 are not identical as referenced above in the sense that the particular ones of slots 296–298 into which they are inserted are differently dimensioned. Moreover, contact 229 has a wider shank than contacts 228 and 230 as contact 229 engages a lamp wire 218, 219 more inboard than the lamp wires 218, 219 engaged by contacts 228, 230. Contact 228 includes a U-shaped bent portion 304 provided with a window 306 therein sized to receive a male blade end of a terminal 233–235. Bent portion 304 is resilient, and when compressed and inserted into a contact insert slot expands to secure contact 228 within insert 226. The contacts 229–231 and associated terminals 233–235 may also be formed integrally and installed into contact insert 226. Contact 228 includes an upwardly extending dual-angled shank portion 308, which abuts contact insert wall 283, and a bent tip portion 310 for guiding lamp insertion. Shank portion 308 contacts the lamp contact wires 2218, 219. U-shaped bent portion 304 includes a bottom leg 312 and an upper leg 314. Upper leg 314 includes a struck out protrusion 316 for providing proper electrical contact with terminal 233 during insertion thereof during assembly.

A second offset type contact, illustrated in FIG. 22, is used for lamp wire contact 231. Contact 231 is similar to contact 228, but also includes an offset portion 318 between shank portion 319 and U-shaped bent portion 320. As a result of the offsetting, when bent portion 320 is installed into central slot 297a, shank portion 319 is offset to a point above contact insert slot 296a to achieve proper electrical contact with lamp wire 219. The operational assembly of lamp wire contacts 228–231 with contact insert 226 involves inserting the U-shaped bent portions of contacts 228, 229, 230 and 231 into contact insert slots 298a, 298b, 296b, and 297a.

Figure 23:
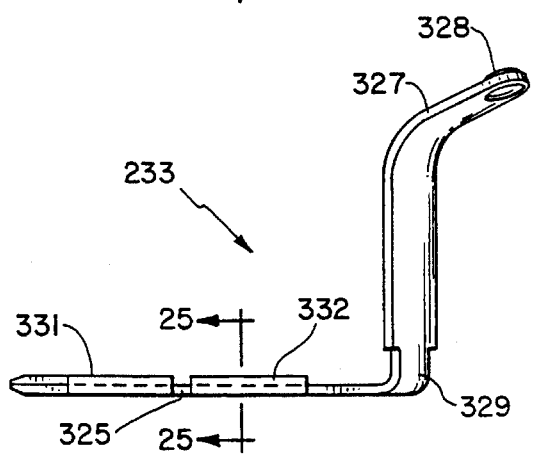
FIG. 23 is a side elevational view of a terminal used for ground and major electrical circuit connections.
Figure 24:
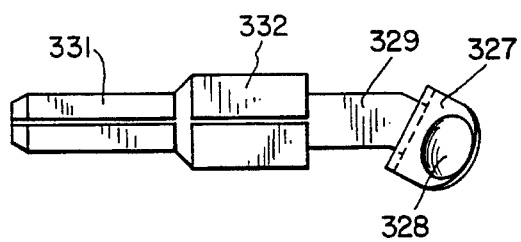
FIG. 24 is a top view of the terminal of FIG. 23.
Figure 25:
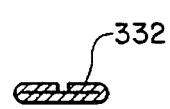
FIG. 25 is a cross-sectional view of the male blade end of the terminal of FIG. 23 as taken along line 25—25.

Referring now to FIGS. 23–25, a first type of terminal for electrically interconnecting the contacts with conductor contact pads 105a–110a of backplate assembly 60 is illustrated. Though explained with reference to terminal 233, this type of terminal is used for both terminals 233 and 234. Terminal 233 includes a male blade end 325 and an upwardly facing pad contact end 327 interconnected by an elbowed segment 329. An upwardly projecting rounded knob 328 makes contact with a contact pad 105a–110a. Elbowed segment 329 includes a beam spring construction proximate pad contact end 327 which provides a spring force that resiliently biases pad contact end 327 upwardly and radially inwardly into engagement with its respective contact pad 105a–110a when lamp socket assembly 201 is mounted to backplate assembly 60. Male blade end 325 terminates at a reduced width elongate tip 331 sufficiently small to pass through contact insert windows 300–302. Tip 331 and blade end intermediate portion 332 are both provided with an increased thickness by means of folding over flanking flaps as shown in FIG. 25, which better promotes electrical connection with contacts 228–231. As male blade end 325 is not radially aligned relative to body 214 when lamp socket assembly 201 is finally assembled, elbowed segment 329 is configured to locate pad contact end 327 relative to male blade end 325 such that pad contact end 327 extends radially outwardly from body 214 when finally assembled.

Figure 27:
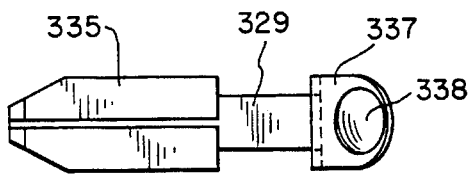
FIG. 27 is a top view of the terminal of FIG. 26.
Figure 26:
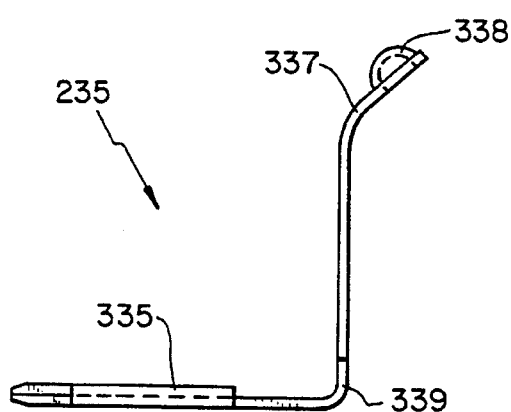
FIG. 26 is a side elevational view of a terminal used for a minor electrical circuit connection.

Referring now to FIGS. 26–27, a second type of terminal used for terminal 235 is illustrated. Terminal 235 includes a male blade end 335 and a pad contact end 337 with contact knob 338. Elbowed segment 339, formed with a beam spring construction, biases pad contact end 337 into engagement with its respective contact pad. The increased thickness male blade end 335 is sized wide enough to prevent passage through contact insert windows 300–302. As male blade end 335 is radially aligned relative to body 214 when lamp socket assembly 201 is finally assembled, elbowed segment 339 is not configured to locate pad contact end 337.

To provide the preferred electrical communication with the internal circuitry of backplate assembly 60, male blade end 325 of terminal 233 is inserted into contact insert slot 298b, through window 302, into contact insert slot 298a. Due to the position of the lamp wire contacts 218, 219 shown in FIG. 10, tip 331 and intermediate portion 332 of male blade end 325 of terminal 233 are thereby electrically interconnected with lamp wire contacts 228 and 229. Terminal 234 used for the major circuit connection is inserted into contact insert slot 296a and through window 300 to allow terminal tip 331 to be electrically connected with lamp contact 230. The intermediate blade end portion 332 of terminal 234 does not make an electrical connection with a lamp wire contact in this embodiment. Terminal 235 is introduced into contact insert slot 297a to be electrically connected with lamp wire contact 231 positioned therein.

Lamp socket assembly 201 may be assembled in the following manner. Molded contact insert 226 is first assembled with a set of contacts 228–231. The U-shaped bent portion of each contact 228–231 is inserted into the appropriate slot 296–298, identified above, of insert base 280 with the intermediate rounded segment 304 of the bent portions of each contact 228–231 facing groove 287 of contact insert 226. The resiliency of the material from which contacts 228–231 are constructed retains the contacts in their respective slots 296–298. Terminals 233–235 are then assembled to contact insert 226 as described above, whereby the various terminal male blade ends 325, 335 engage the protrusions provided on the upper legs of the U-shaped bent portions of contacts 228–231. Contact insert 226 is then inserted into cavity 225 of housing 212. Keys 247 in housing 212 aid in the proper insertion. Contact insert 226 is inserted such that terminals 233–235 radially protruding therefrom align with recesses 242–244. Body 214 is then inserted into socket cavity 225 and is properly oriented therein by means of key 240 and key slot 274. Body 214 captures contact insert 226 in cavity 225 by engagement of contact insert base 280 in contact insert slot 276 of body 214. Thus, contact insert 226 is properly captured and is immovably fixed in socket cavity 225. The assembly is now subjected to sonic welding or another suitable welding technique which is applied to bottom 250 of housing 212. The provision of energy directors 252 with upstanding triangular ribs thereon provides proper guidance to the energy applied by the sonic welding process to provide melting of the triangular ribs portions and securement of body 214 to housing 212. As energy directors 252 are axially oriented with respect to cavity 225 and body 214, body 214 will further enter cavity 225 when energy directors 252 melt as the body and housing are welded together. Sonic welding will be stopped when the distance between the bottom surface of lugs 256 and the top surface of mounting flange 224 is within prescribed limits. By proper design of axial energy directors 252, the strength and uniformity of the sonic weld will be within acceptable tolerances. After sonic welding is complete, axial seal 220 is installed, and lamp 55 is snapped into engagement with retaining fingers 264. Assembly of lamp socket assembly 201 is complete.

Lamp socket assembly 201 can be installed in backplate assembly 60 by inserting lamp 55 from below through the opening extending completely through backplate assembly 60 provided by aligned apertures 69, 86. Lamp socket assembly 201 must be rotated such that lugs 256 align with the keys of keyed aperture 69, at which point lamp socket assembly 201 can be further inserted upwardly. At this point, terminals 233–235 are not aligned properly with the downwardly facing and exposed contact pads 107a, 108a, and 110a. Rotation of lamp socket assembly 201, which is halted by stop shoulder 260 engaging panel 62, causes terminals 233–235 to rotate into engagement with the contact pads. It will be appreciated that the bias of the beam spring construction of the terminals 232–235 ensures the contact pad ends of the terminals will be pressed into engagement with the contact pads 105a–109a. Lamp socket assembly 201 and backplate assembly 60 are then finally assembled and ready for operation.

In view of the foregoing, it will be appreciated that when finally assembled, lamp socket assemblies 200–202 of the present invention and the sealed backplate assembly 60 of the present invention result in a tail light assembly which is fully sealed from external moisture. The inability of moisture to penetrate the assemblies to reach the various electrical circuitry therein translates to a lesser potential for corrosion which may impair or destroy the functionality of the assemblies.

It will be appreciated that when backplate assembly 60 is mounted to lamp housing 40 and lamp socket assemblies 200–202 are installed on backplate assembly 60, only this single unit needs to be attached to the vehicle. Further assembly merely requires that a single mating connector, connected to a single wiring harness passing through a small, grommet-filled hole provided in the trunk space, can be connected to the backplate assembly 60 to thereby provide electrical communication and illumination of the entire tail light assembly.

While this invention has been described as having a preferred design, the present invention may be further modified within the spirit and scope of this disclosure. This application is therefore intended to cover these and any other variations, uses, or adaptations of the invention using its general principles. Further, this application is intended to cover such departures from the present disclosure as come within known or customary practice in the art to which this invention pertains.

What is claimed is:

1. A backplate and socket assembly comprising:
   a first substantially rigid panel, said first panel including a plurality of apertures;
   a second substantially rigid panel, said second panel including a plurality of second apertures, said second apertures being smaller than respective said first apertures, said second apertures aligned with respective said first apertures;
   a plurality of conductors disposed between said first and second panels and sealed therebetween, said conductors including a plurality of contact pads which extend into said first apertures;
   a plurality of lamp sockets respectively disposed in said plurality of first and second apertures, each said lamp socket including contact means for electrically contacting respective said contact pads; and
   sealing means for sealing said lamp sockets to said first panel.

2. The assembly according to claim 1 wherein said sealing means comprises a plurality of upstanding collars surrounding said respective first apertures.

3. The assembly according to claim 1 wherein said sealing means comprises a plurality of upstanding collars surrounding said respective first apertures, and resilient means interposed between respective said collars and respective said lamp sockets.

4. The assembly according to claim 1 wherein said second apertures and said lamp sockets include keying means for ensuring electrical contact between respective said contact pads and contact means.

5. The assembly according to claim 1 wherein said contact means are resilient, said lamp sockets including camming means for camming engagement with said second panel whereby said lamp sockets are retained to said first and second backplates and said contacts are urged into contact with said contact pads.

6. The assembly according to claim 1 wherein said lamp sockets include means for being twistingly received in said apertures, said second panel and lamp sockets including cooperating stop means for positively locating said lamp sockets in said apertures.

7. The assembly according to claim 1 wherein said first and second panels are molded from a plastic material.

8. The assembly according to claim 7 wherein said conductors include terminations for connecting said conductors to an electrical supply, said terminations extending out of said first panel, said first panel including a socket for housing said terminations, said socket integrally molded with said first panel.

* * * * *